(12) United States Patent
Uchida et al.

(10) Patent No.: US 7,880,279 B2
(45) Date of Patent: Feb. 1, 2011

(54) TRANSPARENT EPOXY RESIN COMPOSITION FOR MOLDING OPTICAL SEMICONDUCTOR AND OPTICAL SEMICONDUCTOR INTEGRATED CIRCUIT DEVICE USING THE SAME

(75) Inventors: Kenji Uchida, Kawasaki (JP); Koki Hirasawa, Kawasaki (JP); Katsumi Shimada, Ibaraki (JP); Shinjiro Uenishi, Ibaraki (JP); Shinya Ota, Ibaraki (JP)

(73) Assignees: Nitto Denko Corporation, Osaka (JP); Renesas Electronics Corporation, Kanagawa (JP)

( * ) Notice: Subject to any disclaimer, the term of this patent is extended or adjusted under 35 U.S.C. 154(b) by 641 days.

(21) Appl. No.: 11/668,974

(22) Filed: Jan. 30, 2007

(65) Prior Publication Data

US 2007/0181902 A1   Aug. 9, 2007

(30) Foreign Application Priority Data

Jan. 30, 2006   (JP)   ............................... 2006-20431

(51) Int. Cl.
   *H01L 23/495*   (2006.01)
(52) U.S. Cl. ..................... 257/676; 257/675; 257/100
(58) Field of Classification Search ............... 257/676, 257/675, 100; 528/373
   See application file for complete search history.

(56) References Cited

U.S. PATENT DOCUMENTS 5,120,803 A * 6/1992 Kitahara et al. ............. 525/476
5,969,414 A * 10/1999 Parthasarathi et al. ....... 257/675
6,500,564 B1 * 12/2002 Shiobara et al. ............. 428/620
7,108,914 B2 * 9/2006 Skipor et al. ........... 428/402.21
7,410,305 B2 * 8/2008 Ohe et al. ...................... 385/88
7,541,667 B2 * 6/2009 Miyaki et al. ................ 257/676
2002/0019511 A1 * 2/2002 Morijiri et al. .............. 528/373
2003/0127711 A1 * 7/2003 Kawai et al. ................ 257/666
2004/0169190 A1 * 9/2004 Ueno et al. .................... 257/99
2005/0277745 A1 * 12/2005 Walrath et al. .............. 525/440

FOREIGN PATENT DOCUMENTS

JP   2003-46034 A   2/2003
JP   2003-268200 A   9/2003

* cited by examiner

*Primary Examiner*—Douglas M Menz
(74) *Attorney, Agent, or Firm*—Sughrue Mion, PLLC (57) ABSTRACT

In an optical semiconductor integrated circuit device using a lead frame, a transparent epoxy resin composition for molding an optical semiconductor contains (A) an epoxy resin; (B) a curing agent; (C) a thiol; and (D) an amine-based curing catalyst represented by following Chemical Formula 1:

(Chemical Formula 1)

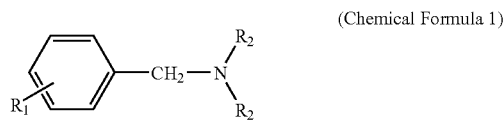

$R_1$: a hydrogen atom (—H), an alkyl group, or a phenyl group
$R_2$: an alkyl group (—$CH_3$, —$C_2H_5$, —$C_3H_7$).

7 Claims, 3 Drawing Sheets

TRANSPARENT EPOXY RESIN COMPOSITION FOR MOLDING OPTICAL SEMICONDUCTOR AND OPTICAL SEMICONDUCTOR INTEGRATED CIRCUIT DEVICE USING THE SAME

This application claims priority to prior Japanese patent application JP 2006-020431, the disclosure of which is incorporated herein by reference.

BACKGROUND OF THE INVENTION

1. Field of the Invention

The present invention relates to a structure of a resin-molded or resin-sealed optical semiconductor integrated circuit device including a lead frame and a transparent resin, in particular, to a structure of an optical semiconductor integrated circuit device having excellent thermal discoloration resistance and crack resistance against high-temperature reflow in the implementation of mounting the optical semiconductor integrated circuit device to equipment.

2. Description of the Related Art

A transparent epoxy resin composition is generally used for resin-molding or resin-sealing an optical semiconductor element such as a light-sensitive element and a light-emitting element mounted in a compact disk (CD) player, a digital versatile disk (DVD) player, or the like.

Electronic appliances have become smaller and lighter while attaining more advanced performance in recent years. This also promoted higher density mounting and surface mounting of optical semiconductor packages.

Examples of such surface-mounting packages include two-way flat packages (small outline packages (SOPs)), four-way flat packages (quad flat packages (QFPs)), and small outline non-lead (SON) packages.

Recently, a package including a lead frame having a silver-plated surface is increasingly used as this type of package.

However, in order to mount such an optical semiconductor device in the form of a surface-mounting package, a solder reflow process is necessary. Moreover, in recent years, regulation on lead has become more stringent due to environmental reasons, and this rendered it necessary to use high temperature as the reflow temperature. As a consequence, heat resistance up to 260° C. has become necessary. Furthermore, when a known epoxy resin composition is used in the reflow step, the package itself absorbs moisture before being exposed to a high temperature. Therefore, the absorbed moisture vaporizes to form moisture vapor during the solder reflow, and the moisture vapor pressure disadvantageously causes the optical semiconductor element to delaminate from the molding resin (cured member).

A typical approach for resolving this problem of delamination of the molding resin by the moisture vapor is to incorporate a large amount of a high-strength structural material such as filler in the molding resin, to increase adhesion between the resin and the substrate and between the resin and the semiconductor, or the like. However, in an optical semiconductor device that emits/receives light, a filler or the like cannot be mixed in the resin because of its special characteristics. Moreover, there is a limit to increasing the adhesion because the color of resin should be prevented from changing. In particular, unlike in other individual optical semiconductors such as LEDs, in an optical integrated circuit including enlarged optical semiconductor elements, it has become difficult to solve the problem due to the increased size of the optical semiconductor device itself.

Under these circumstances, one example of a highly heat-resistant and highly moisture-resistant device structure for an optical semiconductor that can be listed here is an example of an optical integrated circuit including a resin substrate (refer to Japanese Unexamined Patent Application Publication No. 2003-46034 (pp. 3-4, in the Japanese specification and FIGS. 1 and 3)). This optical integrated circuit has a structure in which some metal wires on the resin substrate are made to extend outside a molding resin so that the moisture inside the optical semiconductor device can be drained by utilizing the inherent characteristics of transparent resin having a low adhesiveness on a metal. However, this structure cannot completely resolve the problems of the optical integrated circuit device including a lead frame, namely, the problems of delamination during high-temperature solder reflow (260° C.) and discoloration in the molding resin.

Moreover, as an example of a highly heat-resistant and highly moisture-resistant molding resin for optical semiconductor including a lead frame, there is an example of altering and improving the material contained in the molding resin (refer to Japanese Unexamined Patent Application Publication No. 2003-268200 (pp. 2 to 7 in the Japanese specification)), which is a transparent epoxy resin composition containing a thiol-based compound and a coupling agent so that the adhesion between the resin and the lead frame can be decreased and the moisture inside the optical semiconductor device can be discharged from the interface between the lead frame and the molding resin. However, when an optical semiconductor device including a lead frame is subjected to a high-temperature solder reflow (260° C.) by using this transparent epoxy resin composition, delamination, resin clacking, and discoloration of resin still occur. Thus, it has not been possible to solve the problems.

SUMMARY OF THE INVENTION

Accordingly, the present invention has been made to solve the above-mentioned problems in the related art. An object of the present invention is to provide a transparent epoxy resin composition for molding an optical semiconductor, that can suppress delamination between a semiconductor device and a molding resin, that exhibits excellent solder reflow resistance, and that has excellent thermal discoloration resistance even after a reflow step. Another object of the present invention is to provide an optical semiconductor integrated circuit device incorporating this transparent epoxy resin composition.

In order to achieve the above objects, the present invention comprises the following compositions of (A) to (D) in an optical semiconductor integrated circuit device using a lead frame.

(A) an epoxy resin
(B) a curing agent
(C) a thiol
(D) an amine-based curing catalyst having a structure represented by the following Chemical Formula 1

(Chemical Formula 1)

$R_1$ is a hydrogen atom (—H), an alkyl group, or a phenyl group.

$R_2$ is an alkyl group (—$CH_3$, —$C_2H_5$, —$C_3H_7$).

Here, it is preferable that the thiol (C) is $C_nH_{2n+1}SH$, n=9-15.

Moreover, it is preferable that the amine-based curing catalyst (D) is N,N-dimethylbenzylamine.

Preferably, a glass transition point of the epoxy resin is 90° C. to 120° C.

Moreover, the present invention is the optical semiconductor integrated circuit device using the transparent epoxy resin composition for molding an optical semiconductor and the lead frame, wherein raw materials of the transparent epoxy resin composition and the lead frame are employed so that the ratio of a coefficient of linear expansion of the epoxy resin composition to a coefficient of linear expansion of the lead frame therein within an operation temperature region is 15 or less and that the coefficient of linear expansion of the epoxy resin composition is larger than the coefficient of linear expansion of the lead frame.

Here, it is preferable that the lead frame is at least partly coated on a surface thereof with any coating material of Ag, Pd, and Au.

Moreover, it is preferable that electrical connection is performed with a metal thin wire (or a metal fine wire) between the optical semiconductor integrated circuit element and an external terminal for output provided at an edge of the lead frame, a length of the metal thin wire is 1.2 mm or less, and the metal thin wire is used so that the following Mathematical Formula 1 is complied with by a relation of a tensile strength Y (gf) of the metal thin line to a height T (μm) of the optical semiconductor integrated circuit element.

$$40 \times Y \geq T + 340 (100 \leq T \leq 400) \quad \text{(Mathematical formula 1)}$$

Moreover, it is preferable that physical separation is performed between a region connected with the optical semiconductor integrated circuit element and a region of the external terminal for output, and connection is performed with the metal thin wire between the optical semiconductor integrated circuit element and the external terminal for output.

As described above, the present invention is a semiconductor integrated circuit device in which a surface-mounting package is molded by using a transparent epoxy resin composition for molding an optical semiconductor which includes the following components of (A) to (D).

(A) an epoxy resin
(B) a curing agent
(C) a thiol
(D) an amine-based curing catalyst having a structure represented by the following Chemical Formula 2

(Chemical Formula 2)

$R_1$ is a hydrogen atom (—H), an alkyl group, or a phenyl group.

$R_2$ is an alkyl group (—$CH_3$, —$C_2H_5$, —$C_3H_7$).

That is, in order to achieve the above object, first, the present inventors have studied the cause of generation of the problems in the solder reflow.

As a result of the study, they have found out that moisture vapor vaporizing in the solder reflow is released from the interface between the lead frame and the molding resin and that the problems caused in the solder reflow are effectively solved by improving the thermal discoloration resistance after the reflow step.

From such things, they have repeatedly investigated with a focus on constituents of the transparent epoxy resin composition forming a molding resin (cured material) in order to satisfy, at the same time, the above-described lowering of the adhesive force of the molding resin to the lead frame and the thermal discoloration resistance after the reflow step.

As a result, they have found that when a thiol, i.e., component (C), and an amine-based compound of a curing catalyst that is the above-mentioned component (D) are used together for the transparent epoxy resin composition that is a material for forming a molding resin (cured material), the adhesive force of the molding resin (cured material) to the lead frame is lowered and it is effective in thermal discoloration resistance. Therefore, they have achieved the present invention.

In particular, they have found out that water discharge property in the optical semiconductor device is enhanced by the lowering of the adhesive force of the molding resin (cured material) to the lead frame that a coating layer of silver or of palladium and gold is formed on an outermost layer of, which is frequently used as a lead frame in recent years, and thereby it is possible to provide excellent solder reflow resistance and excellent thermal discoloration resistance that are impossible to be obtained in a conventional transparent molding material. They have confirmed that even if optical semiconductor elements are highly integrated and the optical semiconductor device is enlarged in size, the water discharge in the device can be effectively performed.

Furthermore, they have found that when a specific silane coupling material is used as the above constituent of the transparent epoxy resin composition, the adhesive force of the molding resin to the optical semiconductor element is more improved, and this is more effective for the delamination and so forth in the solder reflow. This is effective particularly in the optical semiconductor integrated circuit in which the optical semiconductor elements in themselves are enlarged in size.

Moreover, when a glass transition point of this transparent epoxy resin composition is set to 90° C. to 120° C., change of phase is initiated as the resin cured material in this temperature range or higher so that the resin composition comes to have low elasticity. They have confirmed that heat stress in a high temperature can be reduced by utilizing the property of this low elasticity.

By this lowering of the adhesive force, the lead frame and the transparent molding resin expand and contract individually by each coefficient of thermal expansion, and delamination between the lead frame and the transparent molding resin is caused in the high-temperature reflow or in a subsequent temperature cycle test. The present inventors have found that as a result of studying various lead frame materials with respect to this problem, when the coefficient of thermal expansion of the transparent molding resin is 15 times or less that of the lead frame in an operation temperature region, this trouble is not caused. For example, use is made of copper as a raw material having this coefficient of thermal expansion.

Moreover, a metal thin wire connecting the optical semiconductor element with the lead frame individually repeats thermal expansion and contraction and frequently leads to breaking due to metal fatigue in the temperature cycle test. Similarly to the first weakness, as a result of studying various metal materials, they have found that the metal thin wire can be prevented from the breaking in the temperature cycle test by using a metal thin wire that has a length of 1.2 mm or less and a tensile strength Y (gf) satisfying the following Mathematical Formula 2 in relation to a height T (μm) of the optical semiconductor integrated circuit element:

$$40 \times Y \geq T + 340 (100 \leq T \leq 400) \quad \text{(Mathematical Formula 2)}$$

An electric signal occasionally leaks in a high-temperature and high-humidity bias test in case where junction is formed without disruption on the lead frame between the optical semiconductor element and an external terminal which are the constitution being usually used in the case of forming a terminal determining a reference potential of the optical semiconductor element and that wire connection is performed between the optical semiconductor element and the external terminal with a metal thin wire. The condition becomes a high temperature and a high humidity in a state that the adhesive force is weak between the lead frame or the metal thin wire and the transparent molding resin, and left ions in the optical semiconductor device are activated by the moisture and the temperature to become movable ions and move through the optical semiconductor element, the lead frame, and the metal thin wire, and thereby to form an electrical feedback loop. In order to prevent such a trouble, it is preferable to constitute, on the lead frame, a region connected with the optical semiconductor element and a region of the external terminal for output that are physically separated entirely.

DESCRIPTION OF THE PREFERRED EMBODIMENTS

Next, embodiments of the present invention will be explained in detail.

The transparent epoxy resin composition for molding an optical semiconductor of the present invention can be obtained by using an epoxy resin (component (A)), a curing agent (component (B)), a thiol-containing compound (a component (C)), and an amine-based curing catalyst represented by the following formula as the curing catalyst:

(Chemical Formula 3)

$R_1$ is a hydrogen atom (—H), an alkyl group, or a phenyl group.

$R_2$ is an alkyl group (—$CH_3$, —$C_2H_5$, —$C_3H_7$).

In general, the transparent epoxy resin composition is in the form of liquid, powder, or tablets made from the powder.

The epoxy resin (component (A)) usable in the present invention is not particularly limited and may be any common transparent epoxy resin.

Examples of the transparent epoxy resins include bisphenol A type epoxy resin, a bisphenol F type epoxy resin, a phenol novolac type epoxy resin, a cresol novolac type epoxy resin, an alicyclic epoxy resin, triglycidylisocyanurate, an epoxy resin with rings containing nitrogen such as a hydantoin epoxy resin, a hydrogenated bisphenol A type epoxy resin, an aliphatic epoxy resin, a glycidyl ether type epoxy resin, a bisphenol S type epoxy resin, a biphenyl type epoxy resin, which is a major cured material with low water absorption rate, a dicyclo type epoxy resin, and a naphthalene type epoxy resin. These can be used alone or in combination of two or more.

Among the above-mentioned various types of epoxy resin, it is preferable to use a bisphenol A type epoxy resin, a bisphenol F type epoxy resin, an alicyclic epoxy resin, or triglycidylisocyanurate from the viewpoint that the color of the cured material of the epoxy resin composition is prevented from changing after the optical semiconductor element is molded with the resin. As such an epoxy resin, an epoxy resin having an epoxy equivalent of 100 to 1000 and a softening point of 120° C. or less is commonly used.

Moreover, as the curing agent (component (B)) that is used together with the above-described epoxy resin (component (A)), an acid anhydride-based curing agent is commonly used from the viewpoint of transparency. Examples thereof include colorless or pale-yellow acid anhydrides such as phthalic anhydride, maleic anhydride, trimellitic anhydride, pyromellitic anhydride, hexahydrophthalic anhydride, tetrahydrophthalic anhydride, methyl nadic anhydride, glutaric anhydride, methylhexahydrophthalic anhydride, and methyltetrahydrophthalic anhydride.

These may be used alone or in combination of two or more. Among the above-mentioned acid anhydride-based curing agents, it is preferable to use phthalic anhydride, hexahydrophthalic anhydride, tetrahydrophthalic anhydride, or a methylhydrophthalic anhydride. The amount of the acid anhydride-based curing agent is preferably set within the range of 30 to 70 parts by weight (hereinafter simply referred to as "parts") per 100 parts of the epoxy resin (component (A)).

Furthermore, in addition to above-mentioned acid anhydride-based curing agents, curing agents, e.g., esters of the above-mentioned acid anhydride-based curing agents formed by esterification with a glycol, and carboxylic acids such as hexahydrophthalic acid, tetrahydrophthalic acid, and methylhexahydrophthalic acid, may be used alone or in combination.

Moreover, the thiol-containing compound, which is a component (C) used together with the above-described components (A) and (B), is preferably a compound containing $C_nH_{2n+1}SH$ (n=9-15) having a carbon number of 9 to 15 such as 1-nonanethiol, 1-decanethiol, 1-dodecanethiol, or 1-pentadecanethiol. Furthermore, these thiol compounds may be generated by pyrolysis or hydrolysis in the epoxy resin composition. If the carbon number is 8 or less, the adhesive force of the epoxy resin composition to the lead frame becomes high. If the thiol has a carbon number of 16 or more, problems regarding moldability and lowering of Tg become significant.

These compounds are used alone or as a mixture of two or more. It is preferable that a content of the above-mentioned compound (a component (C)) is set to 0.25 to 2.0 wt % and more preferably 0.25 to 0.8 wt % of the transparent epoxy resin composition.

As a curing accelerator and a thermal discoloration inhibitor, the following compound is used.

Examples thereof include N,N-dimethylbenzylamine, N,N-diethylbenzylamine, N,N-dipropylbenzylamine, and so on. These can be used alone or in combination of two or more. Moreover, these may be used together with another tertiary amine, an imidazole, a quaternary ammonium salt, an organic metal salt, and a phosphorus compound. Particularly, N,N-dimethylbenzylamine is desirable. It is preferable that the content of the above-mentioned curing accelerator is set to 0.01 to 5 wt %, and particularly preferably, 0.1 to 2.0 wt %. At a content of 0.1 wt % or more, the curing is quick in the molding, and the molding cycle is smoothly carried out. At a content exceeding 2.0 wt %, a gel component is generated in the cured material, the time required for molding is shortened, and the moldability is thereby degraded.

Furthermore, by using a silane coupling agent, the adhesive force between the molding resin (cured material) and the optical semiconductor element is improved, element delamination is prevented during the solder reflow, and reliability in moisture resistance can be improved.

Examples of the coupling agent include amino-based silane coupling agents and epoxy-based silane coupling agents. Among them, an amino-based silane coupling agent is most preferable and an epoxy-based silane coupling agent is second most preferable.

Furthermore, as the coupling agent, a mercapto-based silane coupling agent can also be used. The above-mentioned coupling agents can be used alone or in combination of two kinds or more. Among them, as the amino-based silane coupling agent, it is particularly preferable to use N-(β-aminoethyl)-γ-aminopropylmethyidimethoxysilane. Moreover, as the epoxy-based silane coupling agent, it is particularly preferable to use γ-glycidoxypropyl-trimethoxysilane.

It is preferable that the content of the above-mentioned coupling agent is set to be within the range of 0.05-1.0 wt % and particularly preferably 0.07 to 0.7 wt % with respect to the whole transparent epoxy resin composition. This is because, if the coupling agent content is too low, it is difficult to obtain sufficient improvements in adhesive force of the molding resin (cured material) to the optical semiconductor element, and if too high, moldability tends to be low.

Furthermore, in the transparent epoxy resin composition of the present invention, it is possible to appropriately blend another additive agent other than the above-described components of (A) to (D) that has conventionally been used, according to need. Examples of the additive agent include a mold release agent, a fire-retardant aid, a stress-lowering agent, and a chelating agent.

As the above-mentioned mold release agent, a known polyethylene glycol-based compound may be used. The mold release agent content is preferably as small as possible.

Examples of the chelating agent include dimethylglyoxym, dipicolinic acid, 1,5-diphenylcarbazide, hydroxylethyl iminodiacetate, and methionine. These chelating agents can be used generally in the range of 0.1 to 3 wt % of the whole transparent epoxy resin composition.

The transparent epoxy resin composition used in the present invention can be produced, for example, as follows.

At first, the above-described components of (A) to (D) and the above-described additive agent are appropriately blended. The mixture is charged into a kneader such as a mixing roll, and melted and mixed under heating. Then, the mixture is cooled to room temperature, and then ground by known means, and tabletted according to need. Through above steps, the composition can be produced.

The method of molding an optical semiconductor element with such a transparent epoxy resin composition is not particularly limited. Molding may be performed by a known molding method such as general transfer molding.

For the purposes of the present invention, the term "transparent" means that, for example, the molding resin in cured state exhibits a transmittance of 70% or more, preferably 80% or more, for linear light with a wavelength of 600 nm when the cured resin has a thickness of 1 mm. In the present invention, more preferably, "transparent" means that the cured resin with a thickness of 1 mm exhibits a transmittance of 75% or more and more preferably 85% or more for 400 nm light when measured with a spectrophotometer.

In order to confirm the above-described effect of the transparent epoxy resin composition, samples of transparent epoxy resin compositions with a variety of component proportion were prepared and tested as described below.

Table 1 shows the percentages of the respective components in the epoxy resin composition.

TABLE 1

|  | Sample 1 | Sample 2 | Sample 3 | Smaple 4 | Sample 5 | Sample 6 | Sample 7 | Sample 8 | Sample 9 | Sample 10 | Sample 11 |
|---|---|---|---|---|---|---|---|---|---|---|---|
| Epoxy Resin A | 85.0 | 85.0 | 85.0 | 85.0 | 85.0 | 85.0 | 85.0 | 85.0 | 85.0 | 80.0 | 90.0 |
| Epoxy Resin B | 15.0 | 15.0 | 15.0 | 15.0 | 15.0 | 15.0 | 15.0 | 15.0 | 15.0 | 20.0 |  |
| Epoxy Resin C |  |  |  |  |  |  |  |  |  |  | 10 |
| Curing Agent | 42.7 | 42.7 | 42.7 | 42.7 | 42.7 | 42.7 | 42.7 | 42.7 | 42.7 | 49.1 | 29.3 |
| n-Dodecanethiol | 0.8 | 0.8 | 0.8 |  |  |  |  |  |  | 0.8 | 0.8 |
| n-Nonanethiol |  |  |  |  |  |  | 0.8 |  |  |  |  |
| n-Dodecyl alcohol |  |  |  |  |  |  |  | 0.8 |  |  |  |
| n-Pentadecanethiol |  |  |  |  |  |  |  |  | 0.8 |  |  |
| Oxidation Inhibitor | 1.0 | 1.0 | 1.0 | 1.0 | 1.0 | 1.0 | 1.0 | 1.0 | 1.0 | 1.0 | 1.0 |
| Silane Coupling Agent | 1.0 | 1.0 | 1.0 | 1.0 | 1.0 | 1.0 | 1.0 | 1.0 | 1.0 | 1.0 | 1.0 |
| Curing Catalyst A | 1.0 |  |  | 1.0 |  |  | 1.0 | 1.0 | 1.0 | 1.0 | 1.0 |
| Curing Catalyst B |  | 1.0 |  |  | 1.0 |  |  |  |  |  |  |
| Curing Catalyst C |  |  | 1.0 |  |  | 1.0 |  |  |  |  |  |

Epoxy A: a bisphenol A type epoxy resin (epoxy equivalent = 650)
Epoxy B: triglycidylisocyanurate
Epoxy C: a bisphenol A type epoxy resin (epoxy equivalent = 185)

TABLE 1-continued

|  | Sample 1 | Sample 2 | Sample 3 | Smaple 4 | Sample 5 | Sample 6 | Sample 7 | Sample 8 | Sample 9 | Sample 10 | Sample 11 |
|---|---|---|---|---|---|---|---|---|---|---|---|

Curing Agent; tetrahydrophthalic anhydride
Oxidation Inhibitor; 2,6-dibutyl-4-methylphenol
Silane Coupling Agent; N-(β-aminoethyl)-γ-aminopropylmethyldimethoxysilane
Curing Catalyst A; N,N-dimethylbenzylamine
Curing Catalyst B; 2-ethyl-4-methylimidazole
Curing Catalyst C; 1,8-diaza-bicyclo-(5,4,0)undecene-7

At first, in order to comparatively examine the resistance to thermal discoloration of the above-described epoxy resin compositions, light transmittance in a wavelength of 400 nm was measured by using a spectrophotometer.

The respective components shown in Table 1 were blended in amounts shown and melted and kneaded with a mixing roll (80-130° C.). The resulting mixture was aged, cooled at room temperature, and ground to prepare a desired powdery epoxy resin composition. Next, each of the epoxy resin compositions was transfer-molded (molding condition: 150° C.×4 min), and post-cured under the condition of 150° C.×3 hr to produce a specimen (cured material with a thickness of 1 mm) for measuring light transmittance. The specimen was immersed in liquid paraffin in a quartz cell to suppress scattering of light on the surface of the specimen and the specimen's transmittance for 400 nm light was measured with a spectrophotometer. The observed value is the default value of each of the epoxy resin compositions. In order to confirm the thermal discoloration resistance of each of the epoxy resin compositions, the specimen was sent through a solder reflow furnace (260° C.×3 times), and the transmittance was then measured in the same manner again. In this case, the profile of the reflow was 150° C.×90 sec and 260° C.×10 sec. As a result, it was revealed that the epoxy resin compositions of Samples 1, 7, 10, and 11 exhibited good thermal discoloration resistance. Table 2 shows the observed transmittance of each epoxy resin composition.

Subsequently, the adhesive force of each of the epoxy resin compositions to the lead frame was measured by the test method described below.

Figure 6:
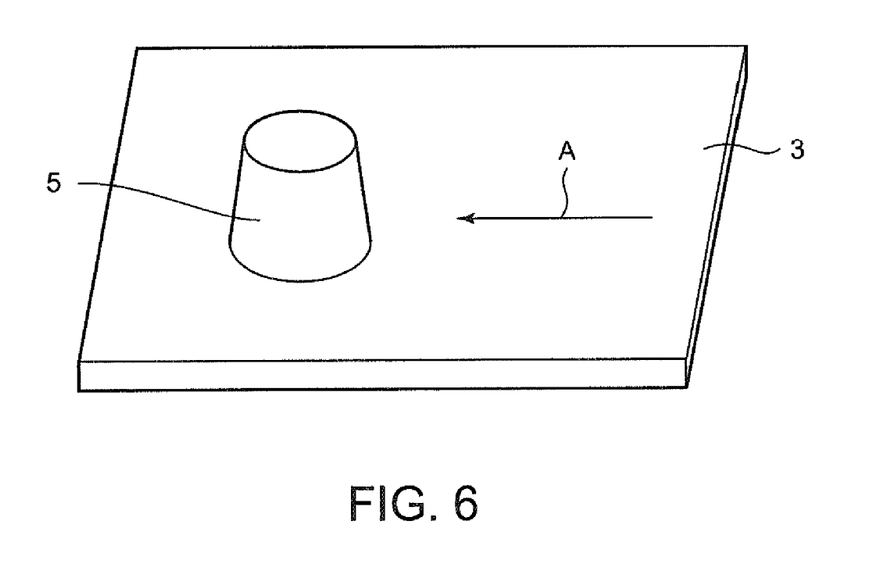
FIG. 6 is an explanatory view illustrating a method for measuring an adhesive force between a cured resin material and a lead frame.

As shown in FIG. 6, an adhesive force-measurement sample constituted from a metal frame plate 3 composed of the same material as the lead frame and a frusto-conical cured resin material 5 disposed on the left end of the surface of the metal frame plate 3 was prepared by a transfer molding method (molding condition: 150° C.×4 min) using each of the epoxy resin compositions described above (the area of the adhering part: 0.25 cm²)

As shown in FIG. 6, while a load was being applied from the side of the cured resin material 5 in the direction indicated by arrow A using a push-pull gauge (not shown), i.e., a fixture, the shear force at the time the cured resin material 5 on the surface of the metal frame plate 3 delaminated from the metal frame plate 3 was measured. This measured value was assumed to be the adhesive force.

The measurement conditions were set to a temperature of 25° C. and a loading rate of 100 mm/min. As a result, it was revealed that the epoxy resin compositions of Samples 1, 2, 3, 7, 10, and 11 had the targeted adhesive force of 0 N/cm² and were good. Table 2 shows the observed adhesive force of the adhesive force measurement sample molded from each of the above-described epoxy resin compositions.

Each of the powdery epoxy resin compositions obtained as described above was used to provisionally produce an optical

TABLE 2

|  |  | Sample 1 | Sample 2 | Sample 3 | Smaple 4 | Sample 5 | Sample 6 |
|---|---|---|---|---|---|---|---|
| Tg | ° C. | 115 | 118 | 117 | 115 | 118 | 117 |
| Default Transmission | at 400 nm | 92 | 92 | 70 | 92 | 92.4 | 70 |
| 260° C. × 3 times | at 400 nm | 87 | 68 | 35 | 82 | 65 | 33 |
|  | Appearance | Transparent | Brownish red | Brownish red | Yellow | Brownish red | Brownish red |
| L/F Adhesive Force | N/cm2 | 0 | 0 | 0 | 12 | 12 | 13 |
| Solder Resistance + TCT property | JEDEC L3 | 0/10 | 0/10 | 0/10 | 10/10 | 10/10 | 10/10 |

|  |  | Sample 7 | Sample 8 | Sample 9 | Sample 10 | Sample 11 |
|---|---|---|---|---|---|---|
| Tg | ° C. | 115 | 115 | 115 | 124 | 95 |
| Default Transmission | at 400 nm | 92.3 | 92.3 | 91.2 | 93.2 | 92.1 |
| 260° C. × 3 times | at 400 nm | 88.2 | 80 | 80 | 88 | 87 |
|  | Appearance | Transparent | Yellow | Yellow | Transparent | Transparent |
| L/F Adhesive Force | N/cm2 | 0 | 15 | 11 | 0 | 0 |
| Solder Resistance + TCT property | JEDEC L3 | 0/10 | 10/10 | 10/10 | 6/10 | 0/10 | semiconductor device for surface-mounting (package size: 4 mm in length×5 mm in width×1 mm in thickness). The resin molding method was that by using a transfer molding method, the resin-molding was performed under the condition of 160° C.×3 min and the post-curing was performed under the condition of 150° C.×3 hr. In the lead frame used in the optical semiconductor device for surface-mounting, a copper material had been plated with palladium. The optical semiconductor device for surface-mounting obtained as described above was pretreated under the condition of JEDEC Level 3 and the solder reflow was performed (260° C.×2), and furthermore, a temperature cycle test (−40° C. to 100° C.) was performed for 300 cycles. After the above-described test, the package appearance was confirmed with respect to delamination and so forth in the semiconductor element surface.

Furthermore, electric characteristics thereof were also confirmed. As a result, with respect to Samples 2 and 3, although they were discolored to yellow by performing the solder reflow, good results were obtained in the above-described test. It was revealed that in the epoxy resin compositions of Samples 1, 7, and 11, no discoloration by the solder reflow occurred, no defect was found in the high-temperature (260° C.) solder reflow after the moisture absorption (pretreatment in JEDEC standard) in the measurement of the above-described optical semiconductor device for surface-mounting and in the subsequent temperature cycle test. These samples also had excellent moisture resistance and heat resistance and good environment resistance. Table 2 shows the result of each of the optical semiconductor devices for surface-mounting using the above-described epoxy resin compositions.

From the above-mentioned results, it was found that with respect to level of thermal discoloration resistance in the reflow, Samples 2 to 6, 8, and 9 were very intensely yellowish compared to Samples 1, 7, 10, and 11, and the transmittances thereof in a wavelength of 400 nm were also significantly low. Specifically, Samples 1, 7, 10, and 11 had high thermal discoloration resistance in the reflow. Moreover, Samples 1, 7, and 11 exhibited a target adhesive force of 0 N/cm$^2$ to the lead frame (L/F), and caused no defects in solder resistance+TCT property. Sample 10 exhibited a Tg higher than that of Samples 1, 7, and 11, and therefore caused defects in solder resistance+TCT property.

From these test results, it was found that the epoxy resin composition containing a thiol component and N,N-dimethylbenzylamine which were contained in Samples 1, 7, and 11 had good heat resistance, moisture resistance, and environment resistance for the optical semiconductor device for surface-mounting.

A method for producing an optical semiconductor integrated circuit device using the transparent epoxy resin composition will now be described.

Figure 1:
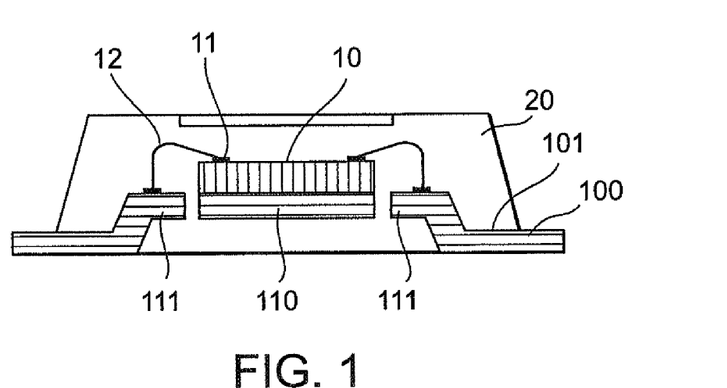
FIG. 1 is a view showing an optical semiconductor integrated circuit device using an SON (Small Outline Non-lead) package structure according to a first example of the present invention.

As a first example, a structure of small outline non-lead (SON) in FIG. 1 is used to illustrate the method for producing an optical semiconductor integrated circuit device according to the present invention.

Figure 2:
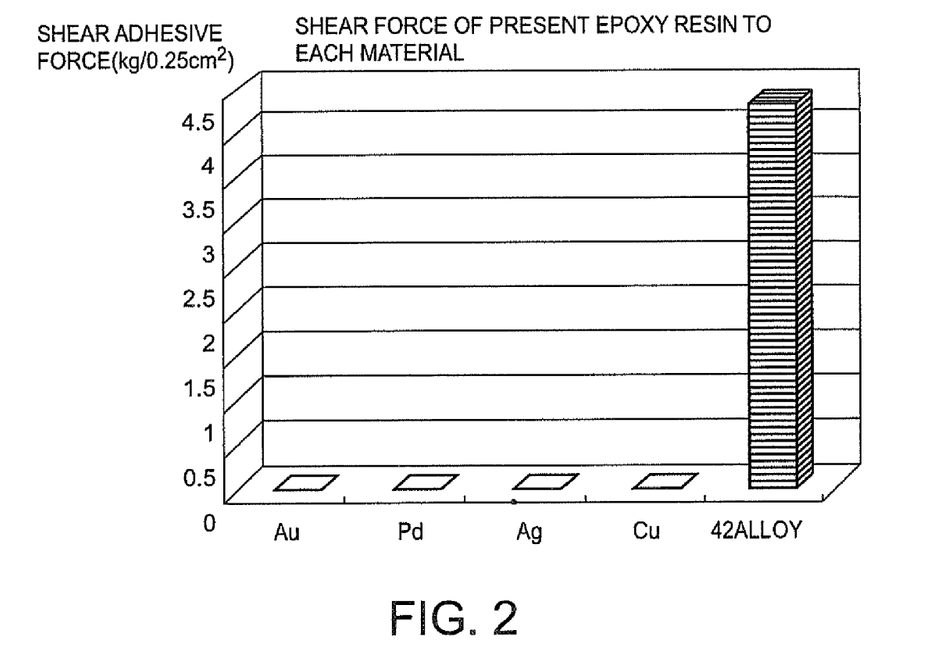
FIG. 2 is a diagram showing a relation between a shear force of the present epoxy resin to each material and a shear adhesive force thereof.

A die pad 110 and an external output terminal 111 are formed by using a lead frame 100 on which a plating layer 101 is formed. In the present Example, as this plating layer 101, Ni, Pd, or Au has been plated on the entire surface of the lead frame 100. As shown in FIG. 2, Pd or Au on the surface has extremely little adhesive force to an epoxy resin composition 20, and therefore can serve a channel for discharging moisture contained in the device of the present Example. Moreover, as the lead frame 100 used in Example, a Cu material is used. The reason for this is as follows.

Figure 3:
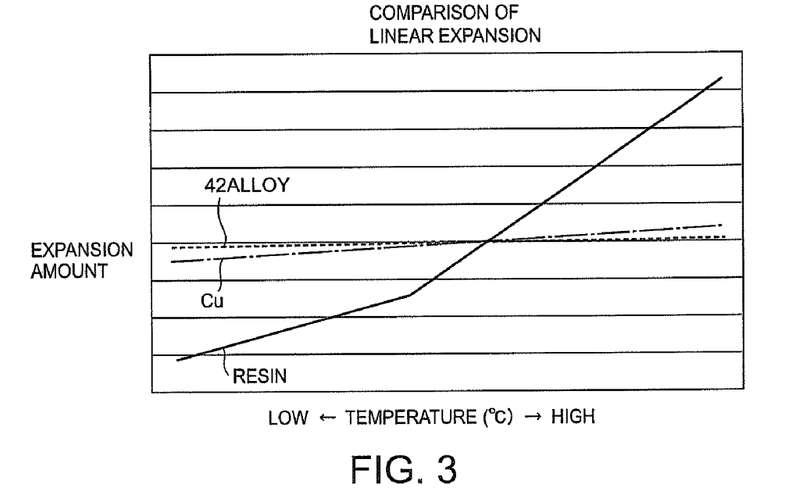
FIG. 3 is a diagram showing comparisons among coefficients of linear expansion of the epoxy resin composition, Cu material, and 42 material (42 alloy), in an operation temperature region thereof.

FIG. 3 shows comparisons among coefficients of linear expansion of the epoxy resin composition 20, and the Cu material and the studied 42 material (42 alloy) for investigation in a temperature region of use.

The coefficient of linear thermal expansion of the 42 alloy was lower than that of the Cu material. The coefficient of linear expansion of the epoxy resin composition 20 was large and had a maximum ratio of thermal expansion of 20 or more in the temperature region for use. On the other hand, in the case of the Cu material, the ratio of thermal expansion was suppressed to 15. Temperature stress due to the thermal expansion and contraction was confirmed by a temperature cycle test. As a result, after 100 cycles, troubles such as generation of cracks in the resin occurred for the 42 material having a thermal expansion ratio of more than 20 with respect to the epoxy resin composition 20. Therefore, in the present Example, a lead frame 100 composed of the Cu material was used.

Furthermore, the external output terminal 111 was physically separated from the die pad 110. The reason for this is as follows.

In the optical semiconductor integrated circuit device using the epoxy resin composition 20, the lead frame 100 with the plating layer, and the metal thin wire 12 described below, the epoxy resin composition 20, the lead frame 100, and the metal thin wire 12 are held together only through weak adhesive force. Moreover, the epoxy resin composition 20 has, as its inherent characteristic, a moisture absorption of 0.1 to 0.26 wt % when left indoor (25±5° C., 24 hr). When a high-temperature and high-humidity bias test was performed in the state that junction is formed on the lead frame 100 between the external output terminal 111 and the die pad 110, leakage of an electric signal occurs at this junction.

This is because under high-temperature high-humidity conditions, remaining ions in the optical semiconductor device are activated by the moisture and the temperature to become movable ions and move through the optical semiconductor element 10, the lead frame 100, and the metal thin wire 12 to thereby form an electrical feedback loop. In order to prevent such a trouble, a region connected with the optical semiconductor element 20 is completely physically separated from a region of the external terminal for output on the lead frame 100.

Next, the optical semiconductor element 10 is bonded to the die pad 110. The bonding of the optical semiconductor element 10 and the die pad 110 can be performed by a known bonding method. For example, a metal bonding method in which AuSn or solder is used and a bond method using an epoxy adhesive agent are perceivable.

Subsequently, electrical connection was performed with a metal thin wire 12 between the output terminal 11 of the optical semiconductor element 10 and the external output terminal 111. As the connection method, the connection was performed by a general wire bonding method, or the like. As the metal thin wire 12, use was made of an Au wire which was excellent in corrosion resistance and had a low value of electric resistance.

Herein, a significant point is in the length and strength of the metal thin wire 12. After preparing two types of the optical semiconductor elements 10 respectively having heights of 300 μm and 160 μm, each of them was bonded to the die pad 110 by using an epoxy resin agent. Next, as the Au wire being metal thin wire 12, use was made of three types which were a low strength type, a normal type having an average strength, and a high strength type. Their thicknesses were set to 25 μm and 30 μm, and the length of the metal thin wire 12 was optionally set and electrical connection was performed between the output terminal 11 of the optical semiconductor element 10 and the external output terminal 111 by a wire bonding method. As the used Au wire, for example, YSoft manufactured by Tanaka Kikinzoku Co., Ltd. was used for the low strength type, SGR-SH manufactured by Sumitomo Metal Mining Co., Ltd. was used for the normal type, and GLF manufactured by Tanaka Kikinzoku Co., Ltd. was used for the high strength type.

Subsequently, the optical semiconductor integrated circuit device was produced by performing the molding of the optical semiconductor element 10 by a transfer molding method by using the above-described transparent epoxy resin composition 20. As described above, holding was performed with weak adhesive force between the epoxy resin composition 20 and (the lead frame 100 and the metal thin wire 12). When a temperature cycle test was performed with the optical semiconductor integrated circuit device, it was confirmed to occasionally cause defect such as deformation or breaking of metal thin wire 12.

Figure 4:
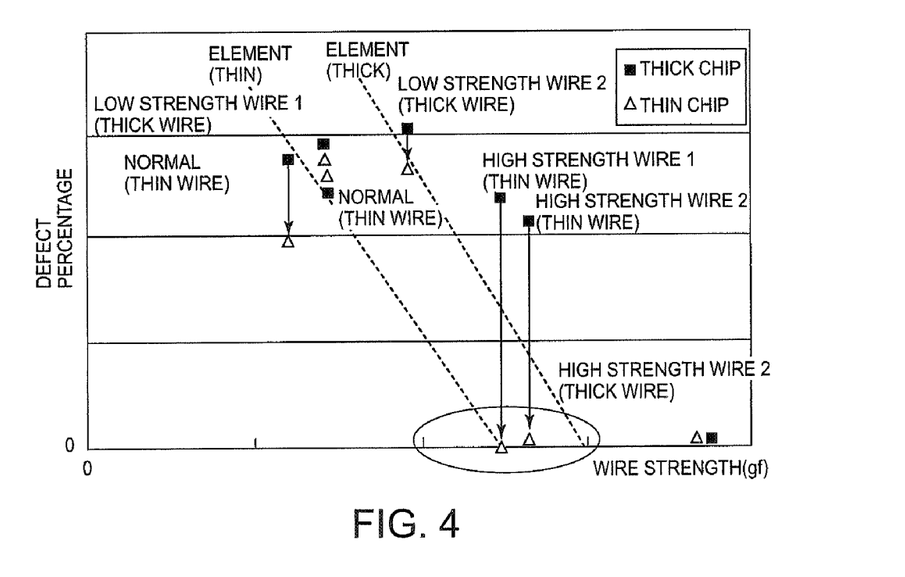
FIG. 4 is a diagram showing a relation between defective rate and wire strength.

One of the results of the test is shown in FIG. 4. The defect percentage indicates a generation rate of the deformation or breaking, due to metal fatigue of the metal thin wire 12 being weak in strength because each of the members are individually repeated to expand and contract in the state of holding the epoxy resin composition 20 and the lead frame 100 and the metal thin wire 12 with weak adhesive force in repeating thermal expansion and contraction by the temperature cycle test. As these results of the test, it has been found that when the metal thin wire 12 having a length of 1.2 mm or less is used so that the following Mathematical Formula 3 is complied with by the relation of a tensile strength Y (gf) of the metal thin wire 12 to a height T (μm) of the optical semiconductor element 10, it is possible to prevent the metal thin wire 12 from breaking in the temperature cycle test.

$$40 \times Y \geq T + 340 (100 \leq T \leq 400) \quad \text{(Mathematical Formula 3)}$$

By using the metal thin wire 12 having a high strength and by thinning the optical semiconductor element 10, it is possible to avoid breaking due to metal fatigue of the metal thin wire 12 by the repeat of thermal expansion and contraction.

In addition, the above-mentioned Au wire products have been used in performing the tests, and preferably comply with the above-described relational formula of strength of the metal thin wire, and are not particularly limited.

Next, the epoxy resin composition 20 is resin-molded so as to cover the optical semiconductor element 10 and the metal thin wire 12, and protection is performed from the external environment with respect to the optical semiconductor element 10 and the metal thin wire 12. Then, the device is completed by separating each of the optical semiconductor integrated circuit devices from the lead frame 100.

In addition, the producing method of the present Example is also applicable to a QFN (Quad Flat Non-lead) package in which the output terminals are formed in four directions.

Figure 5:
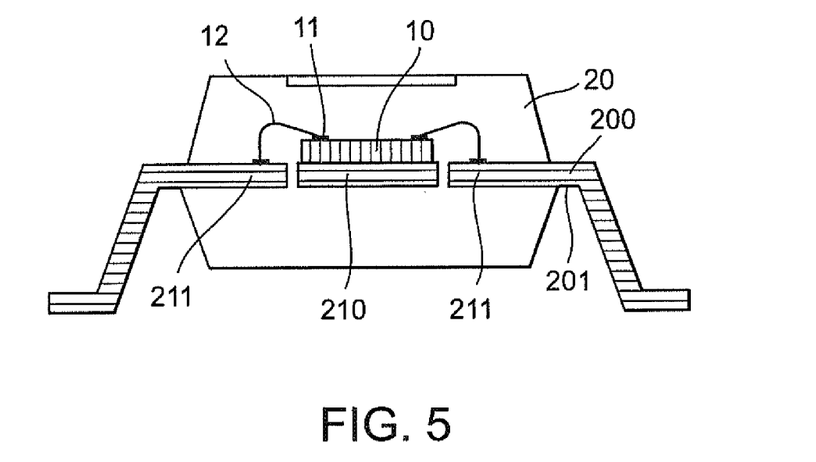
FIG. 5 is a view showing an optical semiconductor integrated circuit device using an SOP (Small Outline) package structure according to the second example of the present invention.

As a second Example, a structure of SOP (Small Outline) package in FIG. 5 is used to illustrate the method for producing an optical semiconductor integrated circuit device according to the present invention.

A die pad 210 and an external output terminal 211 are formed by using a lead frame 200 in which a coating layer 201 is formed. As the lead frame 200 used in the present Example, the 42 alloy material having a mechanical strength stronger than that of the Cu material is used. The coating layer 201 is entirely or at least partly subjected to Ag coating treatment that is generally easy and is more inexpensive than coating treatment with Pd, Au, or the like.

At least a part of the coating layer includes regions of being connected with the metal thin wire 12 of the die pad 210 for mounting the optical semiconductor element 10 and an external output terminal 211, and is a region covered with the epoxy resin composition 20. There is an advantage that the coating treatment cost is inexpensive because the coated area is smaller than that in the case of entirely subjecting the lead frame 200 to the coating treatment. As shown in FIG. 2, Ag on the surface has extremely little adhesive force to the present epoxy resin composition, similarly to Pd or Au of the first Example, and therefore can be a pathway for letting out moisture contained in the device to the outside, in a device of the present Example.

In the present Example, use was made of the 42 material which has caused the trouble in the temperature cycle test of an SON package of the first example. Similarly to the first Example, temperature stress due to the thermal expansion and contraction was confirmed in the temperature cycle test. As a result, more than 100 cycles caused no troubles. Troubles were not caused even in the 42 alloy material whose maximum thermal expansion in the temperature region for the use had a ratio of the coefficient of thermal expansion of the present epoxy resin composition of more than 20 times thereto. This is because the mounted part of the external output terminal has a structure in which lead molding is performed at a position separate from the package. Specifically, it is considered that the temperature stress due to thermal expansion and contraction is relaxed by spring effect of the lead-molded part so that the stress to the package is reduced. From the experiment results, in the present Example, the lead frame 200 in which the 42 alloy material was used was adopted.

Furthermore, similarly to the first Example, the external output terminal 211 is constituted to be physically separated from the die pad 210. In addition, in the present Example, the same transparent epoxy resin composition 20 and the same metal thin wire 12 with the first Example was used.

An optical semiconductor integrated circuit device is produced by using the above-described structure and the materials. At first, the optical semiconductor element 10 is bonded to the die pad 210. The bonding of the optical semiconductor element 10 and the die pad 210 can be performed by a known bonding method. For example, use is made of a metal bonding method in which AuSn or solder is used or a bond using an epoxy adhesive agent, and so on.

Subsequently, electrical connection is performed with a metal thin wire 12 between the output terminal 11 of the optical semiconductor element 10 and the external output terminal 211. As the connection method, the connection is performed by a general wire bonding method, or the like. As the metal thin wire 12, use is made of an Au wire which is excellent in corrosion resistance and has a low value of electric resistance.

In the first Example, as measures for breaking of the metal thin wire 12 with respect to the temperature cycle test, the relational formula has been defined for the length and strength of the metal thin wire 12. However, in the SOP package, the mounted part of the external output terminal 211 has a structure in which lead molding is performed at a position separate from the package as described above. Therefore, each of the length and strength of the metal thin wire 12 has an amount of freedom. Of course, reliability of the package is improved by using the relational formula of the length and strength of the metal thin wire in the first Example.

Next, the epoxy resin composition 20 is resin-molded so as to cover the optical semiconductor element 10 and the metal thin wire 12 so that the optical semiconductor element 10 and the metal thin wire 12 are protected from the external environment. Then, the device is completed by separating each of the optical semiconductor integrated circuit devices from the lead frame 200 and performing the lead molding.

In addition, the producing method of the present Example can be applied to the package other than one in which an output terminal is molded in a gull-wing shape, as long as having a structure in which the external output terminal is mounted by a distance of 2 mm or more from the resin side surface of the package. Moreover, the method is applicable to QFP (Quad Flat package) in which the output terminals are formed in four directions.

In the case of using the transparent epoxy resin composition of the present invention as the molding material, it is possible to exemplify resin-molding of the optical semiconductor element mounted on the lead frame. With respect to the lead frame on which the optical semiconductor element is mounted, it is possible to use, for example, the lead frame that a silver coating layer is formed on a surface thereof.

In the present invention, the lead frame comprising a silver coating layer thereon is a lead frame on which a silver coating layer is entirely or at least partly formed. The silver coating layer is formed in order to enhance bonding property to the lead frame of the metal thin wire that electrically connects the optical semiconductor element and the lead frame.

As the optical semiconductor device in which an optical semiconductor element is resin-molded by using the transparent epoxy resin composition of the present invention, it is possible to exemplify a surface-mounted type optical semiconductor device for which the reflow step is essential.

Specifically, it is possible to exemplify a two-way flat package (Small Outline Package (SOP)), a four-way flat package (Quad Flat Package (QFP)), an SON, and so on.

As described above, a surface-mounted type optical semiconductor device that is mounted on the lead frame has been described. However, the present invention is not limited to the above-described lead frame on which a silver coating layer is formed, and it is possible to use another known lead frame other than the silver coating layer such as, a lead frame on which a palladium coating layer is formed, a lead frame on which a gold coating layer is formed, a copper frame, or a lead frame on which a metal coating layer is not coated. Among them, in the case of combining the lead frame on which a silver coating layer is formed and the transparent epoxy resin composition of the present invention, the most preferable effect comes to be obtained.

Moreover, in the optical semiconductor device of the present invention, it is preferable that independently from its form such as the surface-mounted type, the adhesive force of the transparent epoxy resin composition cured material that is the molding resin is 10 N/cm² or less to the lead frame. Generally, its lower limit is 0 N/cm².

It is possible to measure the adhesive force of the transparent epoxy resin composition cured material to the lead frame, for example, in the following manner.

Specifically, as shown in FIG. 6, it is possible to mold a sample for measuring an adhesive force in which a resin cured material 5 with a circular truncated cone shape is provided on a left end surface of a metal frame plate 3 of the same material with the lead frame (an area of the adhesive part is 0.25 cm²) by a transfer molding method (molding for 150° C.×4 min).

By using this sample, as shown in FIG. 6, a shear force is measured when the resin cured material 5 on a surface of the metal frame plate 3 is delaminated from the metal frame plate 3 along with applying load thereto in the direction of arrow A from a side of the resin cured material 5 by a push pull gauge (not shown) as a measuring jig. The value of the shear force is set to the adhesive force. It is noted here that as the measurement condition, the temperature is set to 25° C. and a rate of progress of the measuring jig is set to 100 mm/min.

Furthermore, in the above explanation, for example, as one form of the optical semiconductor device, description has been made of the surface-mounted type optical semiconductor device in which an optical semiconductor element mounted on the lead frame is resin-molded. However, the present invention is applicable to the surface-mounted type optical semiconductor device in which the optical semiconductor element is mounted on a substrate such as a glass epoxy substrate or a bismaleimide-triazine substrate (BT substrate) instead of the lead frame.

By using this substrate, as shown in FIG. 6, a shear force is measured when the resin cured material 5 on a surface of the metal frame plate 3 is delaminated from the metal frame plate 3 along with applying load thereto in the direction of arrow A from a side of the resin cured material 5 by a push pull gauge (not shown) as a measuring jig. The value of the shear force has been set to the adhesive force. Herein, as the measurement condition, the temperature has been set to 25° C. and a rate of progress of the measuring jig has been set to 100 mm/min.

What is claimed is:

1. A transparent epoxy resin composition for molding an optical semiconductor, comprising following components (A) to (E), in an optical semiconductor integrated circuit device including a lead frame:
    (A) an epoxy resin;
    (B) a curing agent;
    (C) a thiol;
    (D) an amine-based curing catalyst represented by following Chemical Formula 1:

(Chemical Formula 1)

$R_1$: a hydrogen atom (—H), an alkyl group, or a phenyl group
    $R_2$: an alkyl group (—$CH_3$, —$C_2H_5$, —$C_3H_7$); and
    (E) an oxidation inhibitor,
    wherein:
    the thiol (C) is $C_nH_{2n+1}SH$, n=9-12.

2. The transparent epoxy resin composition according to claim 1, wherein:
    the amine-based curing catalyst (D) is N,N-dimethylbenzylamine.

3. The transparent epoxy resin composition according to claim 1, wherein:
    a glass transition point of the epoxy resin is within a range of 90° C. to 120° C.

4. The optical semiconductor integrated circuit device comprising the
    transparent epoxy resin composition for molding an optical semiconductor according to claim 1 and the lead frame, wherein:
    raw materials of the transparent epoxy resin composition and the lead frame are used so that a ratio of a coefficient of linear expansion of the epoxy resin composition to a coefficient of linear expansion of the lead frame within an operation temperature region is 15 or less and that the coefficient of linear expansion of the epoxy resin composition is larger than the coefficient of linear expansion of the lead frame.

5. The optical semiconductor integrated circuit device according to claim 4, wherein:
a surface of the lead frame is at least partly coated with a coating material selected from Ag, Pd, and Au.

6. The optical semiconductor integrated circuit device according to claim 4, wherein:
electrical connection is formed with a metal thin wire between an optical semiconductor integrated circuit element and an external terminal for output provided at an edge of the lead frame,
a length of the metal thin wire is 1.2 mm or less, and
the metal thin wire is used so that a relationship between a tensile strength Y (gf) of the metal thin wire and a height T (μm) of the optical semiconductor integrated circuit element satisfies the following Mathematical Formula 1:

$$40 \times Y \geq T + 340 (100 \leq T \leq 400).$$ (Mathematical Formula 1).

7. The optical semiconductor integrated circuit device according to claim 4, wherein:
A region connected with the optical semiconductor integrated circuit element is physically separated from a region of an external terminal for output provided at an edge of the lead frame, and
the optical semiconductor integrated circuit element is connected to the external terminal for output with a metal thin wire.

* * * * *